United States Patent
Lulla et al.

(10) Patent No.: US 6,757,844 B1
(45) Date of Patent: Jun. 29, 2004

(54) ARCHITECTURE AND LOGIC TO CONTROL A DEVICE WITHOUT A JTAG PORT THROUGH A DEVICE WITH A JTAG PORT

(75) Inventors: Navaz Lulla, Fremont, CA (US); Anup Nayak, Fremont, CA (US); Harish Dangat, Austin, TX (US); Richard L. Stanton, Austin, TX (US)

(73) Assignee: Cypress Semiconductor Corp., San Jose, CA (US)

( * ) Notice: Subject to any disclaimer, the term of this patent is extended or adjusted under 35 U.S.C. 154(b) by 460 days.

(21) Appl. No.: 09/696,714

(22) Filed: Oct. 25, 2000

(51) Int. Cl.[7] .............................................. G06F 11/00
(52) U.S. Cl. ..................... 714/30; 710/5; 714/724; 714/725; 714/726; 714/734
(58) Field of Search ............................. 710/5; 714/30, 714/724, 725, 726, 734

(56) References Cited

U.S. PATENT DOCUMENTS

| | | | |
|---|---|---|---|
| 5,689,516 A | * | 11/1997 | Mack et al. ............... 714/725 |
| 5,706,297 A | * | 1/1998 | Jeppesen et al. ............ 714/30 |
| 5,708,773 A | * | 1/1998 | Jeppesen et al. ............ 714/30 |
| 6,243,842 B1 | * | 6/2001 | Slezak et al. ............... 714/724 |
| 6,282,674 B1 | * | 8/2001 | Patel et al. ................. 714/30 |
| 6,378,090 B1 | * | 4/2002 | Bhattacharya .............. 714/724 |
| 6,430,719 B1 | * | 8/2002 | Slezak et al. ............... 714/734 |
| 6,560,739 B1 | * | 5/2003 | Chung ....................... 714/726 |
| 6,567,932 B2 | * | 5/2003 | Edwards et al. ............. 714/30 |

OTHER PUBLICATIONS

Boundary Scan Descriptive Language for Non–JTAG Components, IBM–Technical Disclosure Bulletin, vol. 36, Issue No. 10, pp. 599–600, Oct., 1993.*
Richard L. Stanton, et al., "PLD Configuration Port Architecture and Logic", U.S. Ser. No. 09/677,062, Field Sep. 29, 2000.
IEEE Standard Test Access Port and Boundary–Scan Architecture, IEEE Std. 1149.1–1990, pp. 1–127.
Supplemental to IEEE Std 1149.1–1990, IEEE Standard Test Access Port and Boundary–Scan Architecture, IEEE Std 1149.1b–1994, pp. 1–68.

* cited by examiner

Primary Examiner—Jeffrey Gaffin
Assistant Examiner—Tammara Peyton
(74) Attorney, Agent, or Firm—Christopher P. Maiorana, P.C.

(57) ABSTRACT

An apparatus comprising a first circuit comprising a JTAG port and a second port. A JTAG non-compliant circuit may be controlled by the JTAG port when connected to the second port.

20 Claims, 10 Drawing Sheets

ARCHITECTURE AND LOGIC TO CONTROL A DEVICE WITHOUT A JTAG PORT THROUGH A DEVICE WITH A JTAG PORT

CROSS-REFERENCE TO RELATED APPLICATIONS

The present invention may relate to co-pending application U.S. Ser. No. 09/677,062 filed Sep. 29, 2000, which is hereby incorporated by reference in its entirety.

FIELD OF THE INVENTION

The present invention relates to a method and/or architecture for controlling a device without a JTAG port and, more particularly, to an architecture and logic to control a device without a JTAG port through a device with a JTAG port.

BACKGROUND OF THE INVENTION

A programmable logic device (PLD) provides an economical and efficient means for implementing predetermined Boolean logic functions in an integrated circuit. Such a device consists of, generally, an AND plane configured to generate predetermined product terms in response to a plurality of inputs, a group of fixed/programmable OR gates configured to generate a plurality of sum-of-product(SOP) terms in response to the product terms, and a number of logic elements (i.e., macrocells) configured to generate a desired output in response to the sum-of-products terms. The sum-of-products terms can also be generated using programmable NOR-NOR logic.

The arrangement and operation of components within the PLD are programmed by architecture configuration bits. The architecture configuration bits are set prior to normal operation of a PLD. The configuration bits can be stored in volatile memory (i.e., SRAM) or non-volatile memory (i.e., EEPROM/flash). The bits are set using an operation called "programming" or "configuration". When the configuration bits are stored in volatile memory, the configuration bits need to be loaded from an off-chip non-volatile memory, a micro controller, or some other source. When an off-chip non-volatile memory is used, the memory can be pre-programmed to contain the necessary configuration data.

A PLD can also be programmed using a JTAG port as specified in the IEEE std 1149.1-1990 specification. The JTAG port can be used to program and test the PLD. However, the off-chip non-volatile (NV) memory devices do not have JTAG ports. In order to reprogram a memory packaged with a PLD, the package would need to have extra pins for the required programming signals. If the PLD and memory are separate chips on a circuit board, the circuit board would need to provide the extra space for the necessary programming circuitry.

A solution that would allow control of a device without JTAG support from a device with JTAG support would be desirable.

SUMMARY OF THE INVENTION

The present invention concerns an apparatus comprising a first circuit comprising a JTAG port and a second port. A JTAG non-compliant circuit may be controlled by the JTAG port when connected to the second port.

The objects, features and advantages of the present invention include providing an architecture and logic that may (i) control a device without a JTAG port through a device that has a JTAG port, (ii) control the operation of any off chip device, (iii) control an off chip flash memory, (iv) allow control of pulse widths of control signals for an off-chip device using run test idle state of the TAP controller, and/or (v) implement a JTAG compliant NV memory device out of a traditional off-the-shelf NV core that has no JTAG interface.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
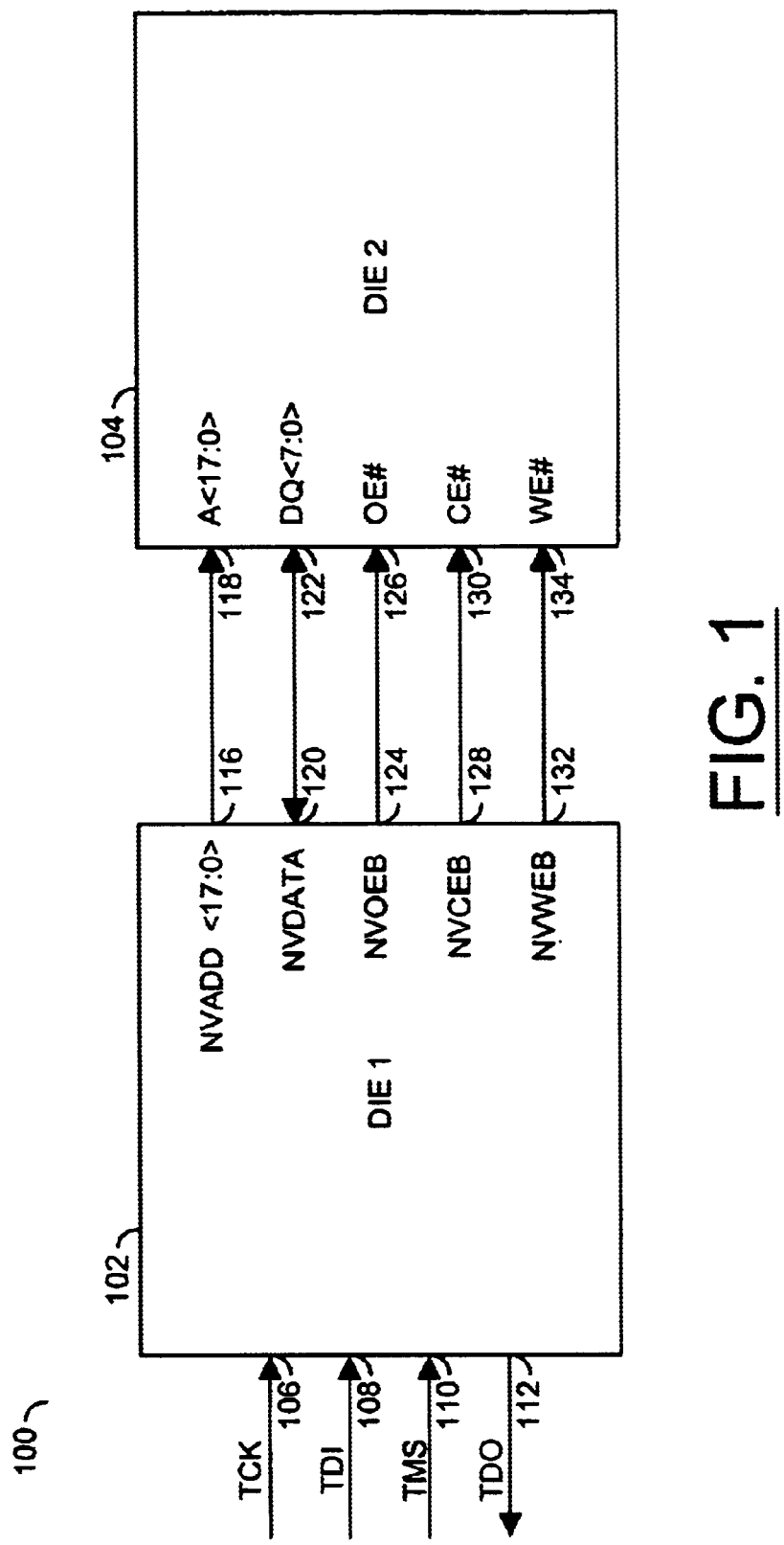
FIG. 1 is a block diagram illustrating a preferred embodiment of the present invention.

Referring to FIG. 1, a block diagram of a circuit 100 is shown in accordance with a preferred embodiment of the present invention. The circuit 100 may be implemented, in one example, as two dies in a single integrated circuit package or two chips on a circuit board. The circuit 100 may comprise a circuit 102 and a circuit 104. The circuit 102 may be a device with JTAG support. The circuit 104 may be a device without JTAG support. In one example, the circuit 102 may be a programmable logic device. The circuit 104 may be, in one example, a non-volatile memory device.

The circuit 102 may have an input 106 that may receive a signal (e.g., TCK), an input 108 that may receive a signal (e.g., TDI), an input 110 that may receive a signal (e.g., TMS), and an output 112 that may present a signal (e.g., TDO). The inputs and output 106–112 may be part of a JTAG port. The signals TCK, TDI, TMS, and TDO may be JTAG signals as specified in the IEEE std 1149.1-1990 specification, published by the Institute of Electrical and Electronics Engineers (IEEE), which is hereby incorporated by reference in its entirety.

The circuit 102 may have a second port that may be configured to match a regular access port of the circuit 104. In one example, the circuit 102 may have an output 116 that may present a signal (e.g., NVADD) to an input 118 of the circuit 104, an input/output 120 that may receive/present a signal (e.g., NVDATA) from/to an input/output 122 of the circuit 104, an output 124 that may present a signal (e.g., NVOEB) to an input 126 of the circuit 104, an output 128 that may present a signal (e.g., NVCEB) to an input 130 of the circuit 104, and an output 132 that may present a signal (e.g., NVWEB): to an input 134 of the circuit 104. However, other port configurations may be implemented accordingly to meet the design criteria of a particular application.

The signals NVADD may be an n-bit address signal, where n is an integer. The signal NVDATA may be an m-bit data signal, where m is an integer. In one example, NVADD may be an 18-bit signal and NVDATA may be an 8-bit signal. The signals NVOEB, NVCSB, and NVWEB may be single or multi-bit control signals.

The circuit 102 may comprise additional logic and JTAG instructions that will allow the circuit 104 to be programmed, read and erased using the JTAG port of the circuit 102 and the regular access ports of the circuit 104.

Figure 2:
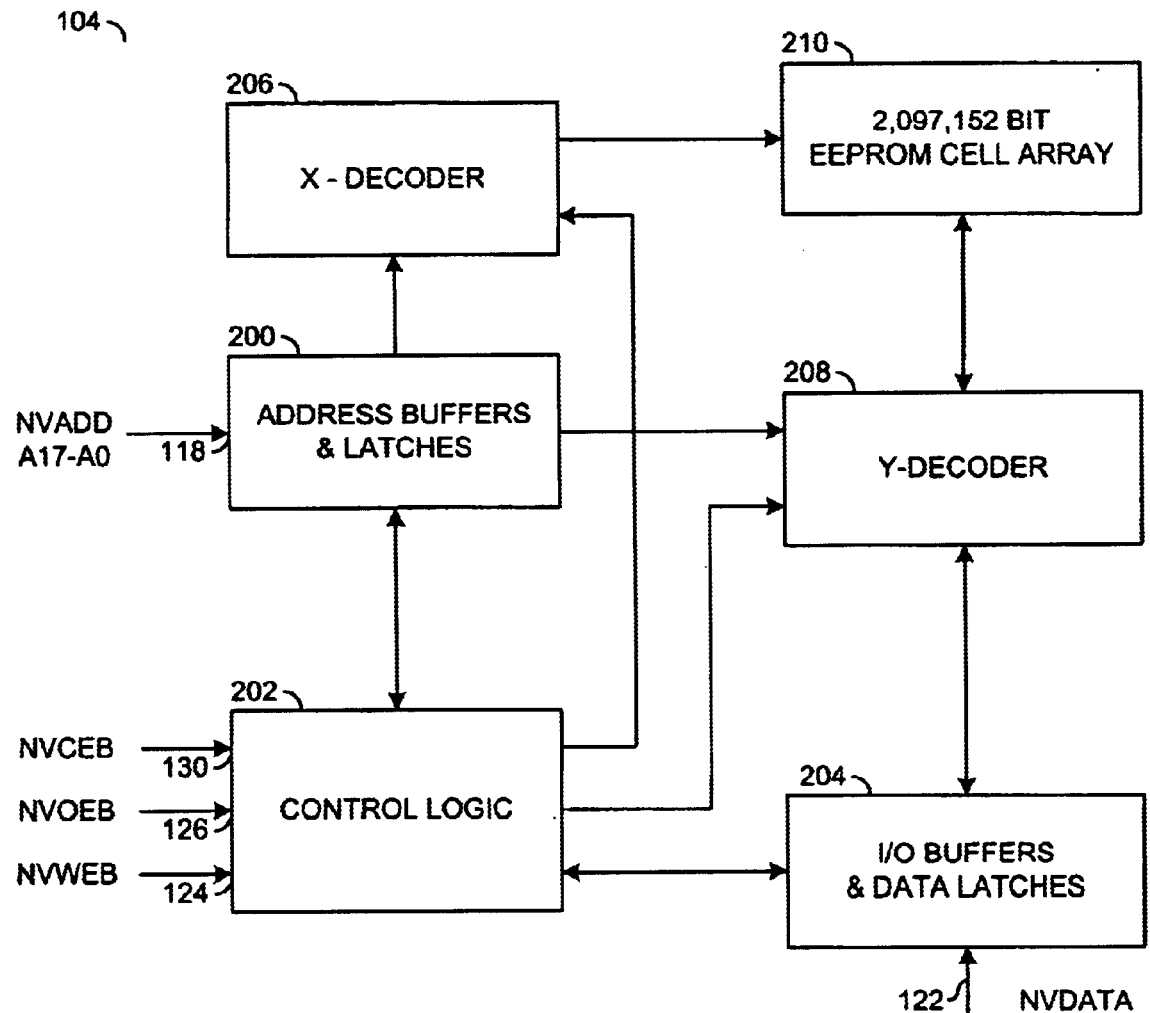
FIG. 2 is a more detailed block diagram illustrating a non-volatile memory device implemented as the die 2 of FIG. 1.

Referring to FIG. 2, a detailed block diagram of the circuit 104 is shown. The circuit 104 may comprise, in one example, a circuit 200, a circuit 202, a circuit 204, a circuit 206, a circuit 208, and a circuit 210. The circuit 200 may be implemented, in one example, as a number of address buffers and latches. The circuit 202 may be implemented, in one example, as a control logic block. The circuit 204 may be implemented, in one example, as a number of I/O buffers and data latches. The circuit 206 may be implemented, in one example, as an X-decoder. The circuit 208 may be implemented, in one example, as a Y-decoder. The circuit 210 may be implemented, in one example, as a memory array.

The signal NVADD may be presented to the circuit 200. The circuit 200 may have connections to the circuits 202, 206, and 208. The circuit 202 may have connections to the circuits 204, 206, and 208. The circuit 204 may have connections to the circuit 208. The circuit 206 and 208 may have connections to the circuit 210.

Figure 3:
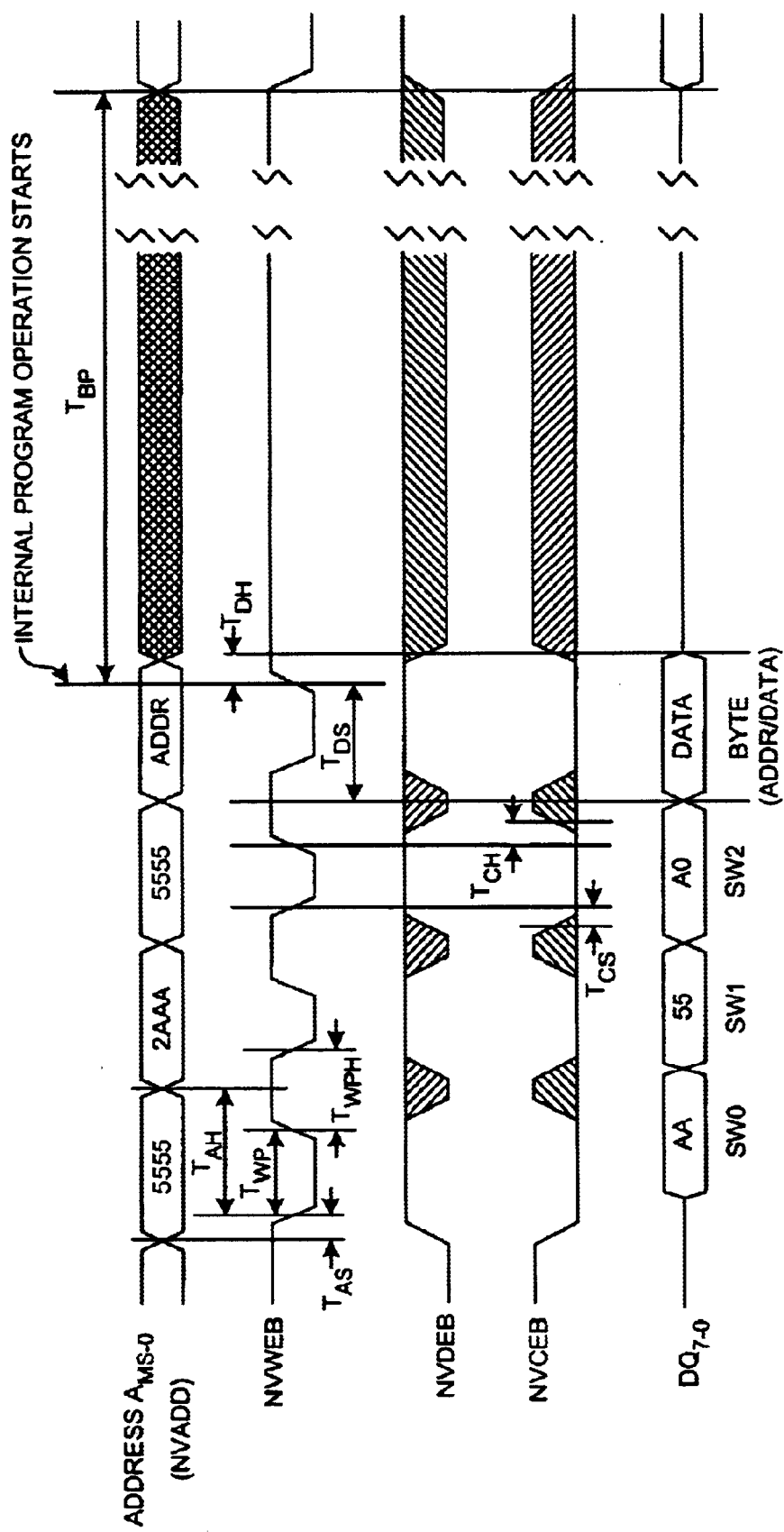
FIG. 3 is a timing diagram illustrating an example write operation of the memory device of FIG. 2.

Referring to FIG. 3, a timing diagram illustrating an example write operation of the circuit 104 is shown. The circuit 104 may be programmed on a byte by byte basis. The programming operation may comprise, in one example, three steps. A first step may be a three-byte-load sequence for Software Data Protection. A second step may be, in one example, loading a byte of address and a byte of data. During the byte program operation, the signal NVADD may be latched on a falling edge of either the signal NVCEB or the signal NVWEB, whichever may occur last. The signal NVDATA may be latched on a rising edge of either the signal NVCEB or the signal NVWEB, whichever may occur first. A third step may comprise an internal program operation that may be initiated after the rising edge of a control signal (e.g., the fourth NVWEB or NVCEB), whichever may occur first. The program operation, once initiated, may be completed, in one example, within 20 microseconds.

Figure 4:
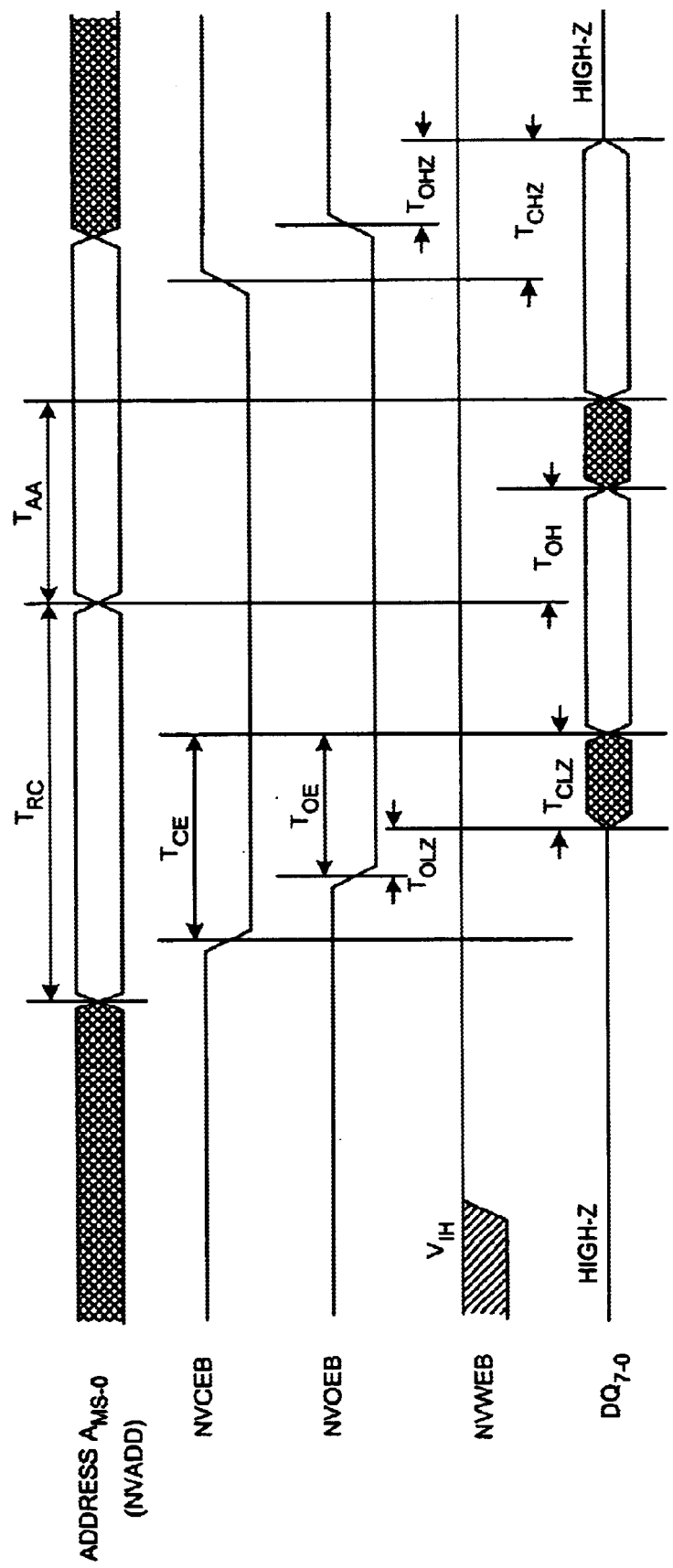
FIG. 4 is a timing diagram illustrating an example read operation of the memory device of FIG. 2.

Referring to FIG. 4, a timing diagram illustrating an example read operation of the circuit 104 is shown. During the read operation, both of the signals NVCEB and NVOEB may be in a LOW state for the system to obtain data from the outputs. The data bus may be in a high impedance state when either the signal NVCEB or the signal NVOEB is HIGH.

The circuit 104 may support a whole chip erase function. The chip erase operation may allow the user to erase the entire memory array 210 to the "1's" state. The erase operation may be initiated, in one example, in response to executing a six byte software data protection command (10H) with address 5555H in the last byte sequence. The internal erase operation may begin with a particular rising edge of an enable signal (e.g., the sixth NVWEB or NVCEB, whichever may occur first).

Figure 5:
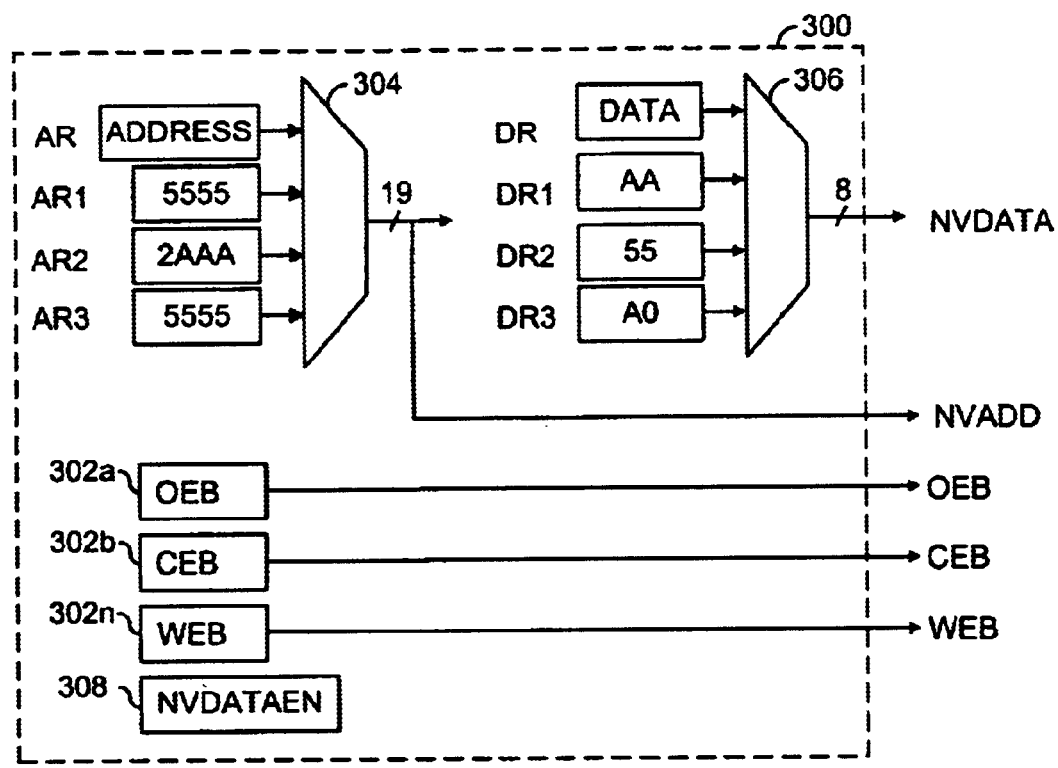
FIG. 5 is a block diagram illustrating a preferred embodiment of the present invention.

Referring to FIG. 5, a block diagram illustrating a preferred embodiment of the present invention is shown. To support the operations of the circuit 104, the circuit 102 may provide an interface port 300 that may be controlled by instructions from the JTAG port. In one example, a dedicated port may be used to interface with the internal non-volatile memory. The port 300 may be used to program the internal flash device and to read configuration data from the internal flash device. In general, a user may have no access to the NV port 300 directly, but rather through the JTAG port. The signals of the NV-port 300 may be defined, in one example, as in the following TABLE 1:

TABLE 1

| Signals | Direction | Definition |
| --- | --- | --- |
| NVADD(18:0) | Output | Nineteen bits of address bits used to access data from NV device. |
| NVDATA(7:0) | Input/Output | Eight data bits. These are inputs when reading data from the NV device, and outputs when writing data to the NV device. |
| WEB | Output | Active low write-enable signal for the NV device |
| OEB | Output | Active low output-enable signal for the NV device. |
| CEB | Output | Active low chip-enable signal for the NV device. |

The NV-port 300 may comprise a number of address registers (e.g., AR-AR3), a number of data registers (e.g., DR-DR3), and a number of individual control registers 302a–302n. The contents of the registers may control programming and verifying operations of the circuit 104. The number of registers is generally determined by the requirements of the circuit 104. The address registers AR-AR3 and the data registers DR-DR3 may be, in one example, 19 and 8 bits wide, respectively. The signal NVADD may be controlled by the set of address registers and the signal NVDATA may be controlled by the set of data registers. In one example, the address registers AR-AR3 may have an output that may present a signal to an input of a multiplexer 304. The multiplexer 304 may select any of the signals from the registers AR-AR3 for presentation as the signal NVADD. Similarly, the data registers DR-DR3 may have an output that may present a signal to an input of a multiplexer 306. The multiplexer 306 may select any of the signals from the registers DR-DR3 for presentation as the signal NVDATA. The individual registers may control, in one example, the signals OEB, CEB and WEB. An extra internal register 308 may contain a flag (e.g., NVDATAEN). The flag NVDATAEN may be set to 1 to enable any write operations on the NV device 104.

The JTAG controller of the circuit 102 may be configured to support a number of new instructions that support programming and reading operations of the circuit 104. In one example, nine new instructions may be provided to accomplish programming and reading back of an on-package flash device. The programming/verify operations may be entirely software controlled by use of the new instructions. The new instructions may comprise a Shift_NVARDR instruction, a Shift_NVCTL instruction, a Flash_Program instruction, a Flash_Read instruction, a Flash_SDP1 instruction, a Flash_SDP2 instruction, a Flash_SDP3 instruction, a Flash_Vfy instruction, and a Flash_shiftSDPARDR instruction.

Figure 6:
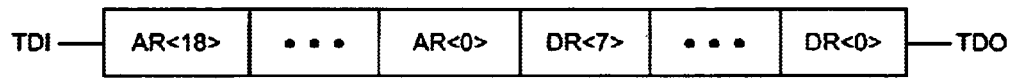
FIG. 6 is a block diagram illustrating an example organization of registers in accordance with the present invention.

Referring to FIG. 6, a block diagram illustrating the address and data registers of FIG. 5 arranged as a NVARDR register is shown. During the Shift_NVARDR instruction, a 27 bit long non-volatile register NV Data (with 19 bits of address, or AR, and 8 bits of data, or DR) may be selected between TDO and TDI during the Shift-DR state of the TAP controller. The LSB of the register bits may be connected to TDO. The MSB may be connected to TDI.

Figure 7:
FIG. 7 is a block diagram illustrating another example organization of registers in accordance with the present invention.

Referring to FIG. 7, a block diagram of a NVCTL register is shown. The registers 302a–302n and 308 may be cascaded to form a 4-bit long control register NVCTL. During the Shift_NVCTL instruction, the register NVCTL may be selected between TDI and TDO. The NVCTL register may be organized as follows: NVDATAEN, WEB, CEB, and OEB. OEB may be connected to the LSB.

The Flash_Program instruction may increment a current address contained in the address register AR. The Flash_Program instruction may allow a byte of data to be programmed into the NV device at the address pointed to by the new contents of address register AR. The Flash_Program instruction may increment the address register (AR) during the capture-DR state of the tap controller. The Flash Program instruction may allow the data register (DR) to be loaded during the shift DR state of the tap controller. The LSB of the data register may be connected to TDO and the MSB may be connected to TDI. Upon entry to the RTI state of the tap controller, the Flash_Program instruction may drive the signal WEB low. When the tap controller exits the RTI state, the Flash_Program instruction may drive the signal WEB HIGH.

The Flash_Read instruction may allow a byte to be read from the flash device addressed by the contents of the register AR. The 8 bits of data on the NVDATA pins may be captured in the capture-DR state of the tap controller into the DR register. The contents of the DR register may be shifted out through TDO in the shift DR state of the tap controller. The LSB of the data register DR may be connected to TDO and the MSB may be connected to TDI.

During the update DR state of the TAP controller, the Flash_SDP1 instruction may select the contents of the address register AR1 and the contents of data register DR1 to be present as the signal NVADD and the signal NVDATA, respectively. The TAP controller may generate a pulse on the signal WEB when the run test idle state of the tap controller is entered and/or exited. The signal WEB generally transitions to a LOW state upon entry to the RTI state from the update-DR state and generally transitions to a HIGH state when the TAP controller exits into select-DR-scan. The signal WEB may allow the data register DR1 to be loaded during the shift DR state of the tap controller. The LSB of the data register DR1 may be connected to TDO and the MSB may be connected to TDI.

During the update DR state of the TAP controller, the Flash_SDP2 instruction may select the contents of address register AR2 and the contents of data register DR2 to be presented as the signals NVADD and NVDATA, respectively. The Flash_SDP2 instruction may generate a pulse on the signal WEB when the run test idle state of the TAP controller is entered and/or exited. The signal WEB generally transitions to a LOW state upon entry to the RTI state from Update-DR and generally transitions to a HIGH state when the TAP controller exits into select-DR-scan. The Flash_SDP2 instruction may allow the data register DR2 to be loaded during the shift DR state of the TAP controller. The LSB of the data register DR2 may be connected to TDO and the MSB may be connected to TDI.

During the update DR state of the TAP controller, the Flash_SDP3 instruction may select the contents of the address register AR3 and the contents of the data register DR3 for to presentation as the signals NVADD and NVDATA, respectively. The Flash_SDP3 instruction may generate a pulse on the signal WEB when the run test idle state of the tap controller is entered and/or exited. The signal WEB may transition to a LOW state upon entry to the RTI state from Update-DR and may transition to a HIGH state when the TAP controller exits into select-DR-scan. The Flash_SDP3 instruction may allow the data register DR3 to be loaded during the shift DR state of the tap controller. The LSB of the data register DR3 may be connected to TDO and the MSB may be connected to TDI.

The Flash_Vfy instruction may allow a byte of data to be read from the NV-data port from the address addressed by the contents of address register AR. The address register AR may be internally incremented for the next operation. The Flash_Vfy instruction may increment the address register AR during the capture-DR state of the tap controller. The incremented address may appear as the signal NVADD during the update-DR state of the tap controller. The 8 bits of data on the NVDATA pins may be captured in the capture-DR state into the DR register. The contents of the DR register may be shifted out through TDO in the shift DR state. The LSB of the data register may be connected to TDO and the MSB may be connected to TDI. The captured data may correspond to the previous address applied to the non-volatile device during the update DR state of the tap controller.

Figure 8:
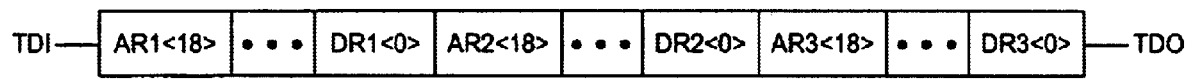
FIG. 8 is a block diagram illustrating an alternative organization of registers in accordance with the present invention.

Referring to FIG. 8, a block diagram illustrating a SDPARDR register is shown. The Flash_ShiftSDPARDR instruction may allow the shifting of data from TDI to address and data register sets 1 through 3 combined in a single shift register (e.g., the SDPARDR register). The address and data register sets 1 through 3 may be concatenated, in one example, in the following order: AR1, DR1, AR2, DR2, AR3, DR3. The MSB of AR1 may be connected to TDI and LSB of DR3 may be connected to TDO.

During the execution of program/verify instructions, the registers of the NV port 300 may operate as follows:

For the Flash_ShiftSDPARDR instruction, there may be one register ((19+8)*3) 81 bits long [AR1+DR1+AR2+DR2+AR3+DR3]. MSB may be on the left (e.g., the MSB of AR1). The length of the register may be equal to the sum of the lengths of the address registers ARs and data registers DRs that are concatenated. The address and the data for the 3 SDP registers (AR and DR) may be shifted during the shift DR state of the tap controller using the Flash_ShiftSDPARDR instruction. The signals NVADD and NVDATA may be updated with the contents of the 81-bit shift register SDPARDR during the update DR state of the tap controller in the Flash_ShiftSDPARDR instruction.

For the Flash_SDPx instructions, there may be one register selected between TDI and TDO during the shift DR state of the tap controller. The register may be a data register (e.g., DRx) depending upon the instruction. The MSB may be connected to TDI.

The address contained in the address register ARx may be available on the NVADD port in the update IR state of the JTAG TAP controller. The NVDATA port may be updated with the contents of the data register DRx in the update DR state of the JTAG TAP controller. After the update IR state of the tap controller, the address selected for the signal NVADD may depend on the instruction executed. Similarly the data selected for the signal NVDATA may depend on the instruction used.

Figure 9:
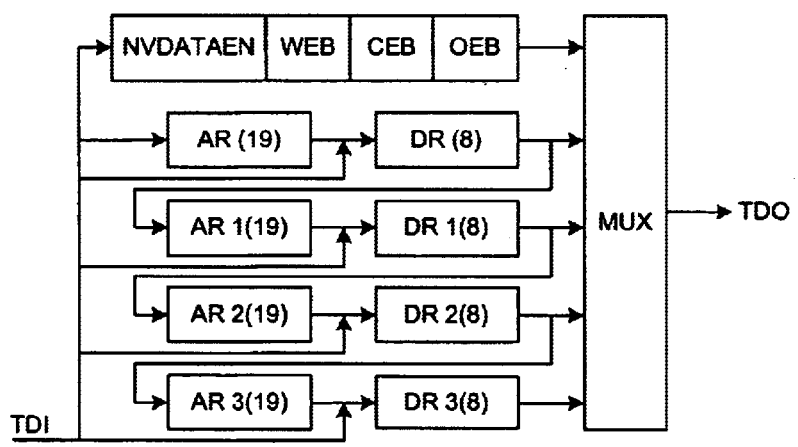
FIG. 9 is a block diagram illustrating an example connection of registers in a JTAG logic module.

Referring to FIG. 9, a block diagram illustrating an example arrangement of the registers AR-AR3, DR-DR3, and NVCTL, between TDI and TDO is shown. In one example, the signal TDI may be presented to an input of the registers NVDATAEN, AR, DR1, DR2, and DR3. The registers NVDATAEN, WEB, CEB, OEB may be concatenated. An output of the concatenated registers may be presented to the signal TDO. An output of the register AR may be presented to an input of the register DR. An output of the register DR may be connected to the signal TDO and the input of the register AR1. An output of the register AR1 may be presented to an input of the register DR1. An output of the register DR1 may be selected as the signal TDO and may be presented to an input of the register AR2. An output of the register AR2 may be presented to an input of the register DR2. An output of the register DR2 may be connected to the signal TDO and to an input of the register AR3. An output of the register AR3 may be connected to an input of the register DR3. An output of the register DR3 may be connected to the signal TDO. When the registers are arranged as shown in FIG. 9, the registers may be concatenated to form one large register. For example, the registers may be concatenated in the order AR, DR, AR1, DR1, AR2, DR2, AR3, DR3. Smaller concatenations of registers may be made. Other arrangements of registers may be implemented to meet the design criteria of a particular application. The outputs of the registers OEB, DR, DR1, DR2, and DR3 may be multiplexed to the signal TDO.

Figure 10:
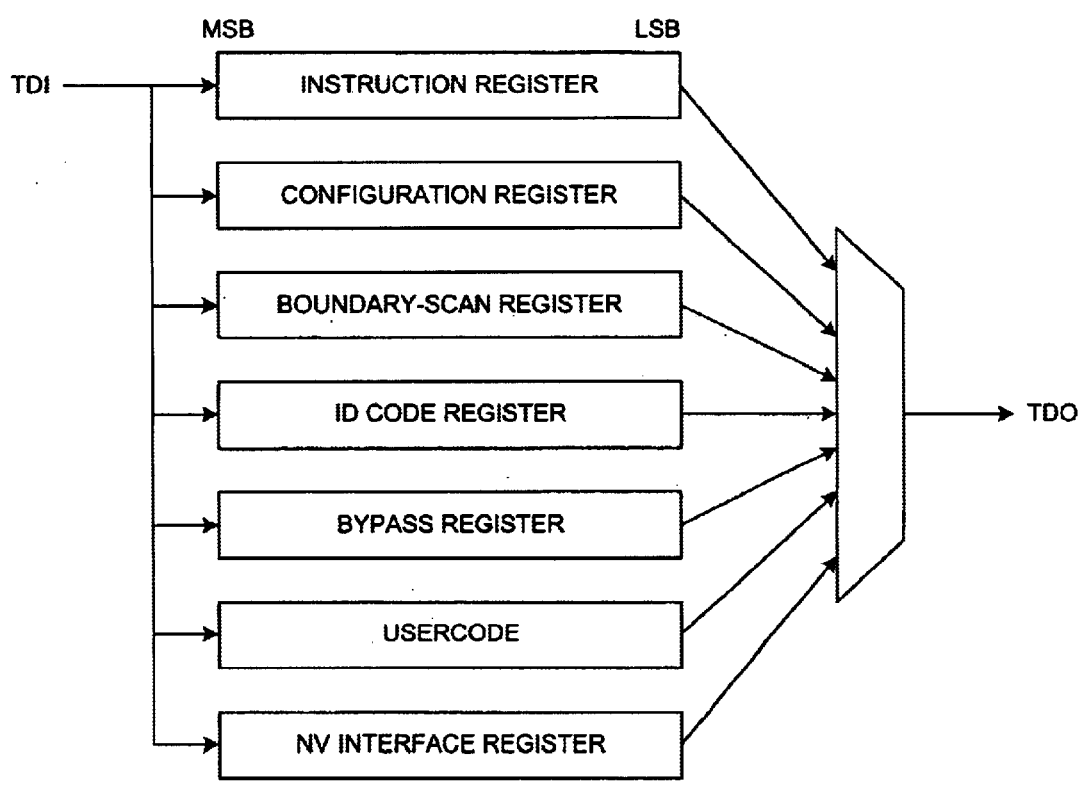
FIG. 10 is a block diagram illustrating a number of JTAG registers in accordance with the present invention.

Referring to FIG. 10, a block diagram illustrating various registers in the JTAG port of the circuit 102. The NV interface register is added to the other registers specified by the IEEE std 1149.1-1990 specification. With the addition of the NV interface register, the JTAG port has two registers that may communicate with I/O pins of the circuit 102. The boundary scan register may be used to test the operation of the circuit 102. In contrast, the NV interface register may be used to control the operation of the circuit 104.

As used herein, the term "issue" generally refers to shifting in and executing a JTAG instruction without shifting any data in the shift-DR state of the tap controller. The term "load" is generally used to shift in and execute the instructions that also requires some data to be shifted into the device during the shift-DR state of the tap controller. The term "read" is generally used to describe an operation where an instruction is shifted in, executed and some data is shifted out of the device during the shift-DR state of the tap controller.

Figure 11:
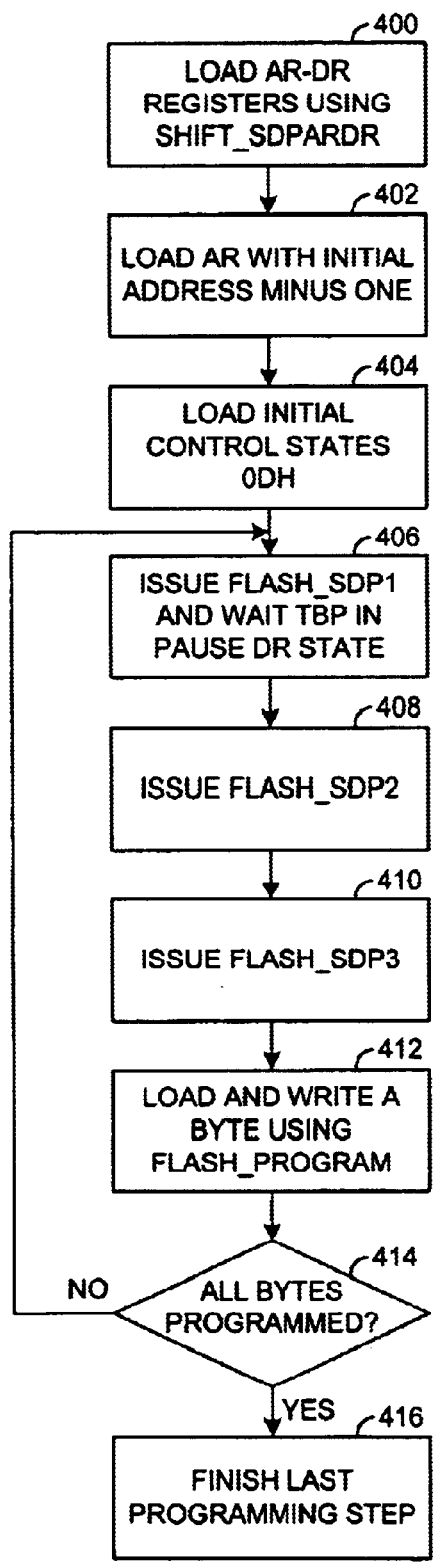
FIG. 11 is a flow diagram illustrating a programming process in accordance with the present invention.

Referring to FIG. 11, a flow diagram illustrating a process for programming the circuit 104 in accordance with the present invention is shown. The process of writing data to the circuit 104 a byte at a time may comprise the following steps:

Step 1: Load AR-DR register sets 1 through 3 using Shift_SDPARDR instruction. When the circuit 104 is implemented as a non-volatile memory device, the AR and DR registers may be loaded as follows: AR1=5555, DR1=AA, AR2=2AAA, DR2=55, AR3:=5555, DR3=A0 (e.g., block 400)

Step 2: Prep the part for the first address to be programmed by loading AR with one less than the first address (e.g., first address −1=00000'H −1=7FFFF'H) using the Shift_NVARDR instruction (e.g., block 402). Step 2 may ensure that the address, when incremented with a subsequent Flash_Program instruction, will generally create the correct first address to be programmed.

Step 3: Load initial control states with the Shift_NVCTL instruction (e.g., block 404). The NV control registers may be loaded, in one example, as follows: NVDATAEN=1, WEB=1, CEB=0, OEB=1 (e.g.,. HEX 0D).

Step 4: Issue the instruction Flash_SDP1 (15 cycles). Wait TBP in pause DR state (e.g., block 406). The states update-DR, run-test-idle, and select-DRScan are generally traversed in that order before capturing the next instruction.

Step 5: Issue the 2nd SDP byte through Flash_SDP2 (15 cycles), e.g., block 408. No need to wait TBP as in step 4. The states update-DR, run-test-idle, and select-DRScan are generally traversed in that order before capturing the next instruction.

Step 6: Issue the 3rd SDP byte through Flash_SDP3 (15 cycles), e.g., block 410. No need to wait TBP as in step 4. The states update-DR, Run-test-idle, Select-DRScan are generally traversed in that order before capturing the next instruction.

Step 7: Load and write a byte of data through Flash_Program (23 cycles) e.g., block 412. The address register AR is generally incremented in the capture-state with the Flash_Program instruction. The byte of data shifted during the shift-DR state will generally be written to the address contained in register AR. The states update-DR, Run-test-idle, Select-DRScan are generally traversed in that order before capturing the next instruction.

Step 8: Repeat steps 4 through 7 for all bytes in the circuit 104 (e.g., block 414).

Step 9: Traverse through the states Select-IR-Scan, Capture-IR, Exit-IR, Pause-IR, Exit2-IR, Update-IR, and Run-Test-Idle sequence waiting TBP in the Pause-IR (e.g., block 416). This allows the completion of the program operation for the last byte of data loaded in step 8. The instruction in the instruction register IR while this sequence is executed generally remains the Flash_Program instruction.

Figure 12:
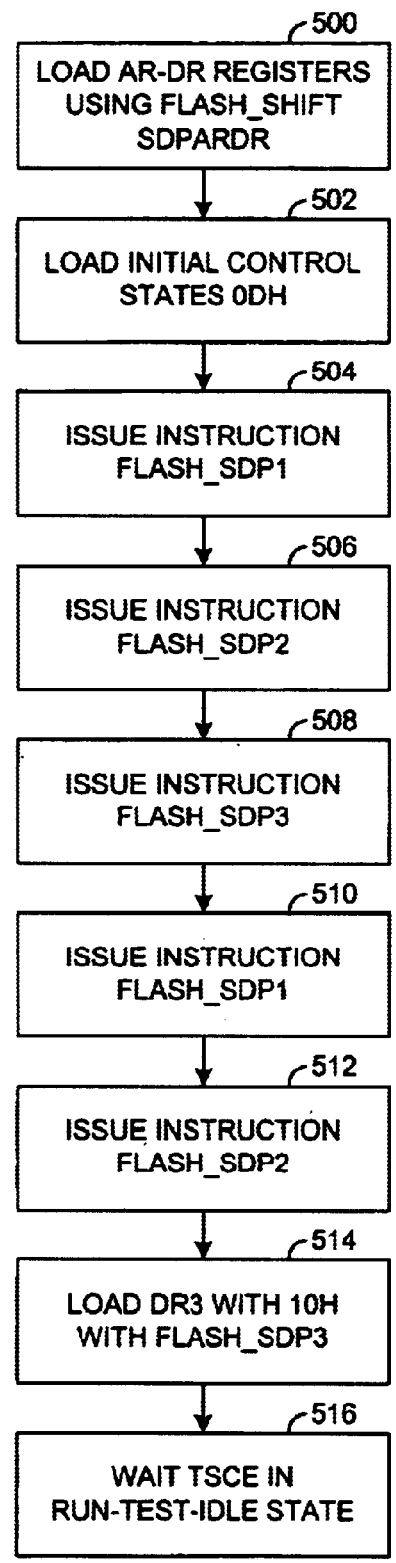
FIG. 12 is a flow diagram illustrating an erasing process in accordance with the present invention.

Referring to FIG. 12, a flow diagram illustrating a process for erasing the memory array 210 of the circuit 104 in accordance with the present invention is shown. The erase operation generally leaves the entire NV device memory array in the '1' state. The erase operation may be initiated by executing a six byte software data protection command sequence with an erase command (e.g., 10H) with address 5555H in the last byte sequence. The internal erase operation on the circuit 104 generally begins with a rising edge of the sixth WEB or CEB whichever occurs last. The following steps are generally executed for the erase operation:

Step 1: Load AR-DR register sets 1 through 3 with data to support the erase operation with Flash_ShiftSDPARDR instructions (e.g., block 500). For an NV device, the contents are generally the following: AR1=5555, DR1=AA, AR2=2AAA, DR2=55, AR3=5555, DR3=80.

Step 2: Load initial control states: NVDATAEN=1, WEB=1, CEB=0, OEB=1 (HEX 0D) through Shift NVCTL instruction (e.g., block 502).

Step 3: Issue instruction Flash_SDP1 (15 cycles) e.g., block 504. The states update-DR, Run-test-idle, Select-DRScan are generally traversed in that order before capturing the next instruction.

Step 4: Issue instruction Flash_SDP2 (15 cycles) e.g., block 506. The states update-DR, Run-test-idle, Select- DRScan are generally traversed in that order before capturing the next instruction.

Step 5: Issue instruction Flash_SDP3 (15 cycles) e.g., block 508. The states update-DR, Run-test-idle, Select-DRScan are generally traversed in that order before capturing the next instruction.

Step 6: Issue instruction Flash SDP1 (15 cycles) e.g. , block 510. The states update-DR, Run-test-idle, Select-DRScan are generally traversed in that order before capturing the next instruction.

Step 7: Issue instruction Flash_SDP2 (15 cycles) e.g., block 512. States update-DR, Run-test-idle, Select-DRScan are generally traversed in that order before capturing the next instruction.

Step 8: Load DR3 with 10H with instruction Flash_SDP3 (24 cycles) e.g., block 514. The contents of the set of AR and DR registers may be the following: AR1=5555, DR1=AA, AR2=2AAA, DR2=55, AR3=5555, DR3=10.

Step 9: Wait TSCE in the Run-test-idle state (e.g., block 516).

Figure 13:
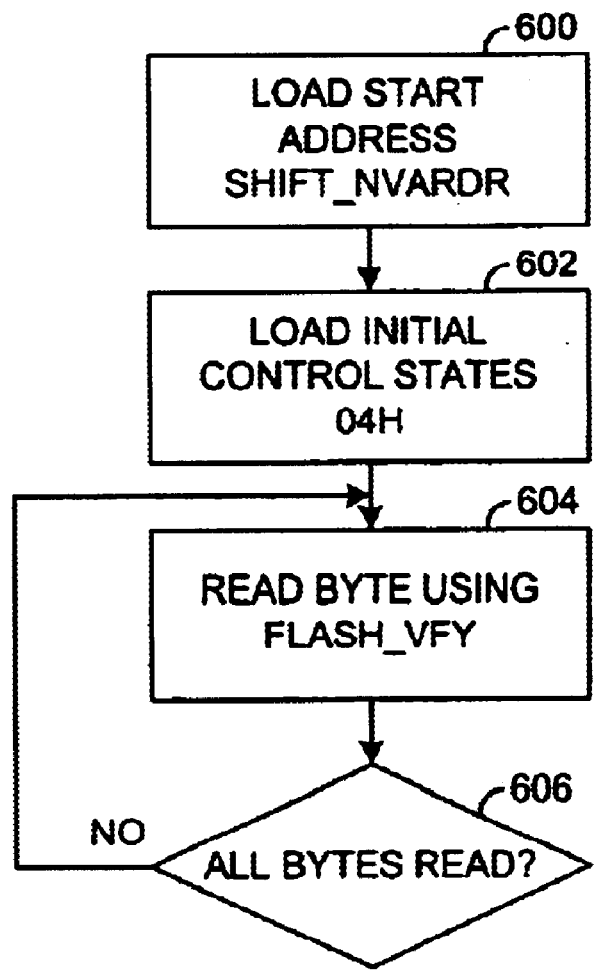
FIG. 13 is a flow diagram illustrating a reading process in accordance with the present invention.

Referring to FIG. 13, a flow diagram illustrating a process for reading from the circuit 104 in accordance with the present invention is shown. The following steps are generally executed for reading from the circuit 104.

Step 1: Load start address (00000H) with Shift_NVARDR (e.g., block 600).

Step 2: Load initial control states: NVDATAEN=0, WEB=1, CEB=0, OEB=0 (HEX 04) through Shift NV_CTL (e.g., block 602).

Step 3: Read a byte of data for the current address with the instruction Flash_Vfy (11 cycles per byte) e.g., block 604.

Step 4: Repeat step 3 to read the next byte, until all bytes are read (e.g., block 606).

The present invention may provide a means of controlling the operations of a device without JTAG port through a device that has a JTAG port. The solution may be generic for controlling the operation of any off chip device. The particular solution may control any off chip flash memory device. Since the pulse width of the control signals (e.g., WE) may be controlled by remaining for a required amount of time in the run-test-idle state of the tap controller, the particular device controlled may be changed to any other memory device without having to undergo any design changes. The present invention may be used to implement a JTAG compliant NV memory device from a traditional off-the-shelf NV core that does not have a JTAG interface.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit comprising a JTAG port and a second port, wherein a JTAG non-compliant circuit is controlled by said JTAG port when connected to said second port, wherein said first circuit and said JTAG non-compliant circuit are mounted in a single integrated circuit package.

2. The apparatus according to claim 1, wherein said first circuit is configured to generate control signals for said JTAG non-compliant circuit in response to contents of a number of registers.

3. The apparatus according to claim 2, wherein said registers comprise one or more address registers.

4. The apparatus according to claim 2, wherein said registers comprise one or more data registers.

5. The apparatus according to claim 2, wherein said registers are concatenated in response to one or more JTAG instructions.

6. The apparatus according to claim 2, wherein said first circuit is configured to execute a number of JTAG instructions for controlling said JTAG non-compliant circuit.

7. The apparatus according to claim 1, wherein said first circuit comprises a number of pads for connecting said first circuit to said JTAG non-compliant circuit.

8. The apparatus according to claim 1, wherein said first circuit and said JTAG non-compliant circuit are mounted on a printed circuit board.

9. The apparatus according to claim 2, wherein said first circuit is configured to control a pulse width of said control signals using a run-test-idle state of a JTAG TAP controller.

10. An apparatus comprising:
    means for receiving JTAG instructions; and
    means for controlling a JTAG non-compliant circuit in response to said JTAG instructions, wherein said first circuit and said JTAG non-compliant circuit are mounted in a single integrated circuit package.

11. A method for controlling a device without a JTAG port through a device with a JTAG port comprising the steps of:
    (A) controlling a port in response to one or more JTAG instructions; and
    (B) controlling a JTAG non-compliant circuit using said port, wherein step (A) comprises the sub-steps of (i) incrementing an address register during a capture-DR state of a TAP controller, (ii) presenting the incremented address to output pins during an update-DR state of the Tap controller, (iii) capturing data presented to an input during the capture-DR state and (iv) shifting out the captured data through a TDO pin during a shift DR state of the TAP controller.

12. The method according to claim 11, wherein step (A) comprises the sub-steps of:
    (A-1) presenting the contents of one or more registers to one or more outputs of said port in response to said one or more JTAG instructions; and
    (A-2) changing the contents of said one or more registers in response to said one or more JTAG instructions.

13. The method according to claim 12, further comprising the step of:
    (A-3) executing said one or more JTAG instructions in a predetermined order.

14. The method according to claim 12, wherein a register is connected between an input pad and an output pad in response to one of said one or more JTAG instructions.

15. The method according to claim 14, wherein said register is 27 bits wide.

16. The method according to claim 14, wherein said register is 4 bits wide.

17. The method according to claim 13, wherein the step (A-2) comprises the sub-steps of:
    (A-2*a*) incrementing an address register during a capture-DR state of a TAP controller;
    (A-2*b*) loading a data register during a shift DR state of said TAP controller;
    (A2*c*) driving a control signal LOW upon entry to an RTI state of said TAP controller; and
    (A-2*d*) driving said control signal HIGH upon exit from said RTI state.

18. The method according to claim 12, wherein the step (A-2) comprises the sub-steps of:
 (A-2a) capturing data from said device without a JTAG port during a capture-DR state into a DR register; and
 (A-2b) shifting the contents of the DR register out through a TDO pin in a shift DR state.

19. An apparatus comprising:
 a first circuit comprising a JTAG port and a second port, wherein a JTAG non-compliant circuit is controlled by said JTAG port when connected to said second port, wherein said first circuit and said JTAG non-compliant circuit are mounted on a printed circuit board.

20. An apparatus comprising:
 a first circuit comprising a JTAG port and a second port, wherein a JTAG non-compliant circuit is controlled by said JTAG port when connected to said second port, wherein (i) said first circuit is configured to generate control signals for said JTAG non-compliant circuit in response to contents of a number of registers and (ii) said registers are concatenated in response to one or more JTAG instructions.

* * * * *